(12) United States Patent
Martinez et al.

(10) Patent No.: US 11,033,990 B2
(45) Date of Patent: Jun. 15, 2021

(54) LOW COST APPROACH FOR DEPOSITING SOLDER AND ADHESIVES IN A PATTERN FOR FORMING ELECTRONIC ASSEMBLIES

(71) Applicant: RAYTHEON COMPANY, Waltham, MA (US)

(72) Inventors: Sergio V. Martinez, Sahuarita, AZ (US); Jeffrey R. Ogorzalek, Attleboro, MA (US); Patrick J. Lott, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 135 days.

(21) Appl. No.: 16/203,815

(22) Filed: Nov. 29, 2018

(65) Prior Publication Data

US 2020/0171609 A1 Jun. 4, 2020

(51) Int. Cl.
*B23K 1/00* (2006.01)
*B23K 37/06* (2006.01)
(Continued)

(52) U.S. Cl.
CPC ............ *B23K 37/06* (2013.01); *B23K 1/0016* (2013.01); *B23K 3/0638* (2013.01); *H05K 3/323* (2013.01);
(Continued)

(58) Field of Classification Search
CPC .... B23K 37/06; B23K 1/0016; B23K 3/0638; B23K 3/0623; B23K 35/025; B23K 2101/42; H05K 3/323; H05K 3/3436; H05K 2203/0126; H05K 2201/09409; H05K 2201/0939; H05K 2201/09381; H05K 3/3484; H05K 3/1241; H05K 3/125; H05K 3/1233; H05K 3/1225; H01L 21/4853; H01L 23/49816; H01L 2924/15311
(Continued)

(56) References Cited

U.S. PATENT DOCUMENTS 4,739,917 A * 4/1988 Baker .................... B23K 1/203
228/123.1
5,740,730 A 4/1998 Thompson, Sr.
(Continued)

FOREIGN PATENT DOCUMENTS

DE 102016116201 A1 3/2018
EP 1181535 A1 2/2002
(Continued)

OTHER PUBLICATIONS

Notification of transmittal of the International Search Report and the Written Opinion of the International Searching Authority, or the Declaration PCT/US2019/059789 dated Mar. 5, 2020; 16 pages.
(Continued)

*Primary Examiner* — Kiley S Stoner
(74) *Attorney, Agent, or Firm* — Cantor Colburn LLP

(57) ABSTRACT

A method for depositing a material to join two surfaces of an electronic assembly includes determining, using dimensions of a pad area of a substrate, a deposition pattern for the material that extends across the pad area of the substrate. The method further includes creating a tool to deposit the material in the deposition pattern that extends across the pad area of the substrate.

5 Claims, 6 Drawing Sheets

(51) Int. Cl.
    *B23K 3/06*     (2006.01)
    *H05K 3/32*     (2006.01)
    *H05K 3/34*     (2006.01)
    *B23K 101/42*   (2006.01)

(52) U.S. Cl.
    CPC ........ *H05K 3/3436* (2013.01); *B23K 2101/42* (2018.08); *H05K 2203/0126* (2013.01)

(58) Field of Classification Search
    USPC .............................. 228/248.1–248.5, 33, 41
    See application file for complete search history.

(56) References Cited

U.S. PATENT DOCUMENTS

| | | | | |
|---|---|---|---|---|
| 5,842,274 | A * | 12/1998 | Modl | H05K 3/3485 29/840 |
| 5,872,051 | A * | 2/1999 | Fallon | B23K 1/0016 438/616 |
| 5,942,062 | A | 8/1999 | Hassall et al. | |
| 6,114,769 | A * | 9/2000 | Thompson, Sr. | H05K 3/3436 257/780 |
| 6,143,991 | A * | 11/2000 | Moriyama | H05K 3/3436 174/261 |
| 6,175,086 | B1 * | 1/2001 | Nakamura | H05K 3/3485 174/261 |
| 6,316,289 | B1 | 11/2001 | Chung | |
| 6,599,365 | B1 | 7/2003 | Jiang et al. | |
| 6,610,430 | B1 * | 8/2003 | Thompson, Sr. | H05K 3/3436 428/209 |
| 6,780,028 | B1 * | 8/2004 | Kennedy | H01R 43/0235 439/83 |
| 7,243,834 | B2 * | 7/2007 | Mori | B41N 1/248 228/22 |
| 7,665,648 | B2 * | 2/2010 | Pan | H01L 24/14 228/41 |
| 8,770,462 | B2 | 7/2014 | Beair et al. | |
| 10,099,318 | B2 * | 10/2018 | Rossberg | B23K 31/02 |
| 2002/0185020 | A1 * | 12/2002 | Sakai | H05K 3/3484 101/127 |
| 2002/0185309 | A1 * | 12/2002 | Imamura | H01R 43/0256 174/261 |
| 2003/0056665 | A1 * | 3/2003 | Tanaka | B41F 15/36 101/127.1 |
| 2004/0218808 | A1 * | 11/2004 | Prince | H05K 3/1233 382/150 |
| 2007/0164079 | A1 * | 7/2007 | Mori | H05K 3/341 228/101 |
| 2009/0085227 | A1 * | 4/2009 | Shiraishi | H05K 3/3484 257/778 |
| 2013/0214310 | A1 * | 8/2013 | Wang | H01L 24/81 257/98 |
| 2013/0323526 | A1 * | 12/2013 | Hasin | H01L 31/02008 428/599 |
| 2014/0146505 | A1 * | 5/2014 | Su | H05K 3/3436 361/771 |
| 2015/0036307 | A1 * | 2/2015 | Stone | H05K 1/0386 361/767 |
| 2015/0163969 | A1 | 6/2015 | Nakatsuji et al. | |
| 2017/0123525 | A1 * | 5/2017 | Kao | G06F 3/04164 |
| 2018/0005971 | A1 * | 1/2018 | Lee | H05K 3/3494 |

FOREIGN PATENT DOCUMENTS

| | | | | |
|---|---|---|---|---|
| JP | 63115169 | A * | 5/1988 | ............... G03F 1/00 |
| JP | 07106745 | A * | 4/1995 | |
| JP | 08242072 | A * | 9/1996 | |
| JP | 2007281055 | A * | 10/2007 | |
| WO | 2008128754 | A1 | 10/2008 | |

OTHER PUBLICATIONS

Swanson, Don, "Dispensing Solder Pastes in Surface Mount Assembly", 8307 Electronic Packaging & Production, 34 (1994) Apr., No. 4, Newton, Mass., US, p. 50-52, XP000439311.

* cited by examiner

LOW COST APPROACH FOR DEPOSITING SOLDER AND ADHESIVES IN A PATTERN FOR FORMING ELECTRONIC ASSEMBLIES

BACKGROUND

The present disclosure relates to electronic assemblies, and more particularly, to depositing solder and adhesive in a pattern for forming electronic assemblies.

In electronic assemblies, electronic components are mounted onto one or more circuit boards. Each bare circuit board includes two or more layers that each includes patterned electrical interconnections. The interconnections terminate in pads or other contacts on the surface of the circuit board, onto which corresponding pads of the electronic components are mounted and joined by solders and/or adhesives. Semiconductors and other active and passive components, for example, are bonded to the pads on the circuit board by solder and/or adhesives, which provides both mechanical bonding and allows electrical connections from each component to the pad interconnections on the circuit board.

Processes for bonding the various components to a circuit board can include, for example, depositing a solder paste and/or adhesive onto a particular area, such as a metalized pad, of a circuit board. Each component is then placed onto a specific geometrically spaced pad array. The placement can be done automatically, for example, using robotic equipment. The material can be cured to form a solid union, bonding the components to their respective pads or designated areas on the circuit board.

SUMMARY

According to one or more embodiments of the present invention, a method for depositing a material to join two surfaces of an electronic assembly includes determining, using dimensions of a pad area of a substrate, a deposition pattern for the material that extends across the pad area of the substrate. The method further includes creating a tool to deposit the material in the deposition pattern that extends across the pad area of the substrate.

According to other embodiments of the present invention, a method for depositing a material to join two surfaces of an electronic assembly includes using a tool to deposit an array of discrete domains of the material in a deposition pattern that extends across a pad area of a substrate. The deposition pattern includes an array of discrete domains that extends across the pad area of the substrate and has a tangency with respect to an edge of the pad area of about or less than 0.127 millimeters (mm).

According to some embodiments of the present invention, a system for depositing a material on a surface of a substrate of an electronic assembly includes a tool that deposits a material in a deposition pattern within a pad area of the substrate. The deposition pattern includes an array of discrete domains of the material that extends across the pad area of the substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
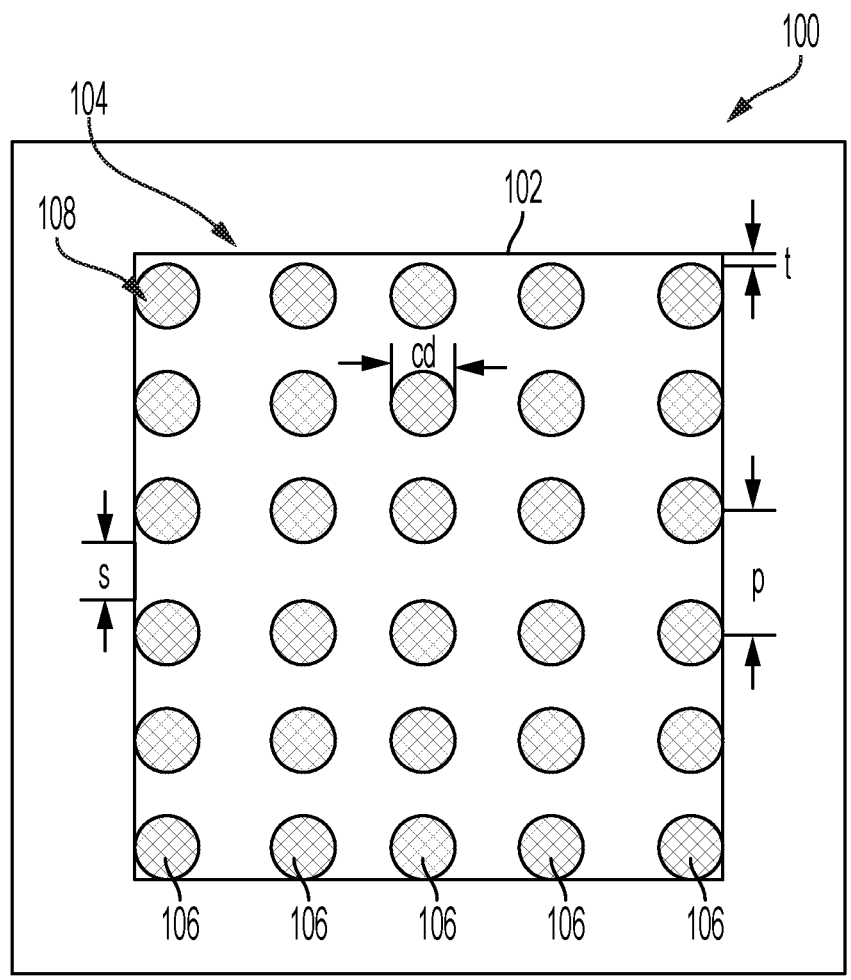
FIG. 1A depicts a top view of an array of discrete domains of a material on a pad area of a substrate according to one or more embodiments of the present invention.

For the sake of brevity, conventional techniques related to printed circuit board (PCB) device assembly and fabrication may or may not be described in detail herein. Moreover, the various tasks and process steps described herein can be incorporated into a more comprehensive procedure or process having additional steps or functionality not described in detail herein. In particular, various steps in the manufacture of printed circuit board assemblies are well known and so, in the interest of brevity, many conventional steps will only be mentioned briefly herein or will be omitted entirely without providing the well-known process details.

Turning now to an overview of technologies that are more specifically relevant to aspects of the invention, pure tin (Sn) plating has replaced tin-lead (SnPb) alloy solders in many electronic applications, for example, electrical hardware, circuit board traces, component leads, and ground planes. Replacing tin-lead alloy solders with pure tin plating is driven in part by environmental and health concerns about lead.

The "whisker" or "tin whisker" phenomenon is a failure mode associated with some electronic devices that use a number of low melting point elements (e.g., tin (Sn), cadmium (Cd), zinc (Zn), nickel (Ni), and indium (In)) in operations such as soldering. Tin whiskers can form at a component interface, such as on bottom termination components (BTCs), of a pure (or substantially pure) tin-based surface. Whiskers can also form on other surfaces, such as nickel surfaces. Generally, metal whiskers have a small mass (for example, less than 100 micrograms) with a high surface area-to-volume ratio. Because metal whiskers are conductive and can carry high current, they can result in electronic shorting failures. Metal whiskers also have an unpredictable growth rate, which makes controlling the manufacturing conditions to mitigate their formation challenging.

Various approaches have been used to mitigate formation of metal whiskers (e.g., tin whiskers) in electronic devices that include metal surfaces (e.g., pure tin surfaces or nickel surfaces). One approach to mitigating tin whiskers includes applying a conformal coating to tin surfaces. However, tin whiskers can still grow through conformal coatings. Another costly approach includes replacing and finishing the pure tin surface with an alternative material, which is costly and time consuming.

Other approaches to mitigating whisker formation include tin-lead solder dipping and tin-lead solder wicking. Tin-Lead solder dipping is a process in which metal surfaces of microelectronic components with an undesirable metallization (i.e., pure tin, thick gold, etc.) are dipped into a molten eutectic or close to eutectic tin-lead solder pot to partially or completely remove the undesirable metallization and replace it with a desirable one. This process can be fully or partially automated with system controls to deliver a compliant resurfaced microelectronic component with necessary surface flatness for robust solder joint formation and reliability. However, drawbacks of these processes include high costs, long lead times, and high risks of collateral damage from exposing sensitive components to molten hot solder.

Solder wicking, on the other hand, is a manual process in which solder from a solder wire is melted by a soldering iron over a surface with undesirable metallization. The process, however, can only provide a partial coating of desirable metallization (i.e., tin-lead), which does not guarantee that the final resurfaced product will meet metallized surface flatness requirement. However, drawbacks of this process include limited capabilities for removing the undesired metallization, difficulties in providing necessary surface flatness, and challenges with using manual machinery on small metallized surfaces.

Currently, there are no industry standards for solder coverage in electronic assemblies. Thus, much of the industry is driven to reduce solder coverage, and reduce costs, by not extending the solder to the perimeter of the pad area on the surface of the substrate. However, full perimeter coverage of a tin alloy, such as a leaded tin alloy solder, would be needed to effectively mitigate whisker formation at the periphery of the pad.

Although the previously described methods can mitigate tin whisker growth to various degrees, the impact associated with additional component processing, board assembly processing, and materials typically result in significant increases in cost, cycle time, and risk of damage to microcircuits and/or entire circuit card assemblies.

Turning now to an overview of the aspects of the invention, one or more embodiments of the invention address the above-described shortcomings of the prior art by providing methods and systems that deposit solder and/adhesives as a pattern that includes an array of discrete domains that extends across a defined pad area of a substrate, for example, an electronic part that forms part of a such as a printed circuit board. Using the dimensions of the defined pad area as input, the optimum dimensions and locations (e.g., tangency, pitch, spacing, critical dimension, and height) of the array of discrete domains within the pad area are determined to maximize coverage (e.g., spread) across pad. When solder is used to form the array, the solder can include an element that mitigates tin whisker growth, such as lead (Pb). The discrete domains of the array can extend to the edge or perimeter of the defined pad area.

The above-described aspects of the invention address the shortcomings of the prior art by providing advantages and technical benefits, including a low cost solder and adhesive deposition method and system, as conventional tools can be used, and circuit card assemblies, equipment and materials do not need to be altered. The cost of manufacturing is also lower because less solder and/or adhesive is used, compared to deposition of a continuous conformal layer. When solder is used, the footprint of the array is also optimized to mitigate whisker formation. Pure tin electrical components can therefore be provided at much lower costs. Such components also will be produced on a shorter time scale, compared to manufacturing methods that include alternate plating options or other time consuming methods for mitigating whiskers, e.g., tin whiskers. The array can also be used on gold plated pads to mitigate gold embrittlement risks. The optimized solder and adhesive coverage offers both electrical and thermal performance improvements, and in the case of gold plated pads, solder joint reliability improvement by reducing gold embrittlement risk. The aforementioned aspects of the invention also improve product cycle time and cost by eliminating the need for additional resurfacing processes previously mentioned.

A failure due to gold embrittlement can, in many instances, only be manifested when the product is on the field and operational. Therefore, the potential cost incurred to field failures and collateral damage can reach exponential magnitudes. The aforementioned aspects of the invention therefore can impart substantial savings in cost.

Figure 1B:
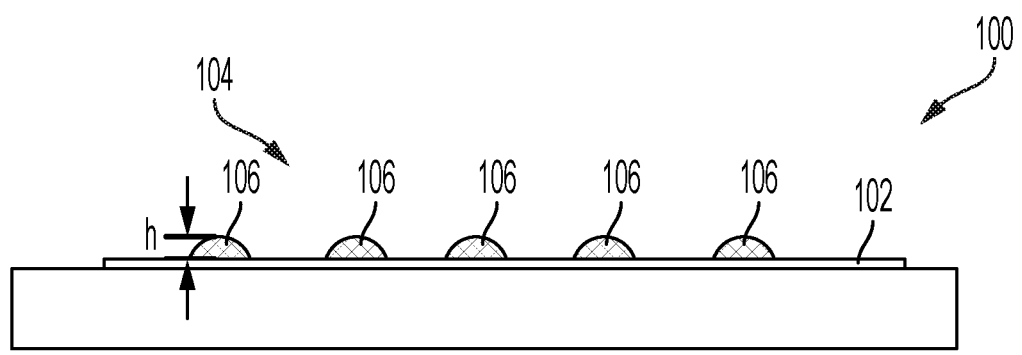
FIG. 1B depicts a side view of FIG. 1A.

Turning now to a more detailed description of aspects of the present invention, FIG. 1A depicts a top view of an array 104 of discrete domains 106 of a material on a pad area 102 of a substrate 100 according to one or more embodiments of the present invention. FIG. 1B depicts a side view of FIG. 1A. The array 104 of discrete domains 106 is deposited, using a deposition tool, in the deposition pattern shown to extend across the pad area 104 of the substrate 100. After combining the substrate 100 with a second substrate, the array 104 of discrete domains will join (or combine) two surfaces to form part of an electronic assembly.

The substrate 100 can be a part of any device or assembly, such as an electronic device or assembly. Such devices and assemblies include, but are not limited to, circuit boards and assemblies, electrical component leads, electronic packaging, or other like devices.

According to one or more embodiments of the present invention, the substrate 100 is, or is part of, a bottom termination component (BTC) or microcircuit, which is a leadless component for which terminations are plated and are on the underside of the package. The case pad is directly connected to the printed circuit board (PCB). BTC components can have any dimensions, lead counts, or designs. Non-limiting examples of a bottom termination microcircuit include a quad-flat no-lead (QFN), a dual-flat no lead (DFN), a TO-252 (also known as a Decawatt package (DPAK)), or any case connected bottom termination component.

According to other embodiments of the present invention, the substrate 100 is part of a device or application that includes a tin-containing surface that can form tin whiskers.

The substrate 100 includes a pad area 102 (also referred to as a case pad, thermal pad, ground, or ground pad herein) which is the area onto which the contact forming material, such as a solder paste or adhesive, would be placed. The pad area 102 is an interfacing contact surface. The pad area includes a thermally conductive material according to some embodiments of the present invention. The pad area 102 is raised, depressed, or flush with respect to the surface of the substrate 100. Non-limiting examples of materials for the pad area 102 include tin, tin alloys, gold, gold alloys, copper, copper alloys, palladium, palladium alloys, or any combination thereof.

The shape of the pad area 102 is not limited to a square as shown in FIG. 1A, for example. The shape of the pad area 102 depends on the type of substrate 100 and can vary. Other non-limiting examples of shapes for the pad area 102 include a rectangle, circle, oval, triangle, pentagon, hexagon, T-shape, H-shape, or any combination thereof.

An array 104 of discrete domains 106 of the material, such as solder and/or adhesive, are disposed on the pad area 102. According to some embodiments of the present invention, substrate 100 is a BTC, the pad area 102 is a thermal or electrical pad, and the discrete domains 106 of the material is solder paste. Solder paste includes solder powder of a metal or metal alloy, mixed with a flux vehicle. According to some embodiments of the present invention, the solder-powder composition portion of the solder paste is a metal or metal alloy that includes a material, such as lead (Pb) that mitigates whisker formation. Non-limiting examples of solder paste compositions include, for example, tin-lead. (SnPb), tin-lead-silver (SnPbAg), tin-silver-copper (SnAgCu), tin-silver-bismuth (SnAgBi), tin-bismuth (SnBi), tin-indium (SnIn), or any combination thereof. The flux vehicle portion of the solder paste includes, for example, rosin or resin polymer, one or more solvents, one or more flux chemicals, stabilizers, rheological control additives, preservatives and wetting agents.

According to other embodiments of the present invention, the substrate 100 is, or is a part of, a circuit board, electrical component lead, electronic packaging, or other like devices, the material is an adhesive, and the pad area 102 is a defined area onto which the array 104 of the adhesive is to be disposed. The adhesive is a thermally conductive adhesive, such as, but is not limited to, Room-Temperature-Vulcanizing (RTV) silicone. Other non-limiting examples of adhesives include silver filled compounds and urethane based materials.

The geometry, dimensions, and pattern of the array 104 of discrete domains 106 is optimized to maximize solder coverage (spread) across the pad area 102. The shape of the discrete domains 106 are not limited to circles or spheres as shown in FIG. 1A, for example. The shape of each of the discrete domains 106 depends on the type of substrate 100, and the shape and dimensions of the pad area 102, and can therefore vary. Other non-limiting examples of shapes for the discrete domains 106 include a rectangle, oval, triangle, pentagon, hexagon, or any combination thereof.

To maximize coverage across the pad area 102, the discrete domains 106 of the array 104 extend across (spread) and out to the edge (or perimeter) of the pad area 104, for example, as shown in area 108. Thus, the tangency (t) of the discrete domains 106 of the array is 0 according to one or more embodiments of the present invention. According to other embodiments of the present invention, the tangency (t) of the discrete domains 106 is about 0.025 to about 0.127 millimeters (mm). According other embodiments of the present invention, the tangency (t) of the discrete domains 106 is about or less than 0.127 mm. Having a tangency that is 0 or close to 0 ensures that the material extends to the edge of the pad area 102 so that whiskers are mitigated out to this edge when the material of the discrete domains is solder paste. When the material of the discrete domains 106 is adhesive, having a tangency that is 0 or close to 0 also ensures optimal adhesion.

Each of the discrete domains 106 of the array 104 has a critical dimension (cd) that varies and depends on the shape and dimensions of the pad area 102. According to one or more embodiments of the present invention, the critical dimension (cd) of each discrete domain 106 is about 0.254 to about 1.016 mm. According to other embodiments of the present invention, the critical dimension (cd) of each discrete domain 106 is about 0.483 to about 0.762 mm. Although, the critical dimension (cd) of the discrete domains 106 is not limited to these ranges and can be within any range, which again depends on the substrate 100, pad area 102, material of the discrete domains 106, and particular application.

The discrete domains 106 of the array 104 are disposed within the pad area 102 in a deposition pattern, with the discrete domains having regular spacing (s) there between. According to one or more embodiments of the present invention, the spacing (s) of the discrete domains 106 of the array 104 is about 0.001 to about 0.254 mm. According to other embodiments of the present invention, the spacing (s) of the discrete domains 106 of the array 104 is about 0.076 to about 0.203 mm. Although, the spacing (s) of the discrete domains 106 of the array 104 is not limited to these ranges and can be within any range, which again depends on the substrate 100, pad area 102, material of the discrete domains 106, and particular application.

The discrete domains 106 of the array 104 have a regular pitch (p), or center-to-center distance between nearest neighbor discrete domains 106. According to one or more embodiments of the present invention, the pitch (p) of the discrete domains 106 of the array 104 is about 0.254 to about 1.27 mm. According to other embodiments of the present invention, the pitch (p) of the discrete domains 106 of the array 104 is about 0.559 to about 0.965 mm. Although, the pitch (p) of the discrete domains 106 of the array 104 is not limited to these ranges and can be within any range, which again depends on the substrate 100, pad area 102, material of the discrete domains 106, and particular application.

Each of the discrete domains 106 of the array 104 has a height (h) or thickness (see FIG. 1B) that varies and depends on the shape and dimensions of the pad area 102. According to one or more embodiments of the present invention, the height (h) of each discrete domain 106 is about 0.025 to about 0.254 mm. According to other embodiments of the present invention, the height (h) of each discrete domain 106 is about 0.076 to about 0.152 mm. Although, the height (h) of the discrete domains 106 is not limited to these ranges and can be within any range, which again depends on the substrate 100, pad area 102, material of the discrete domains 106, and particular application.

After depositing the array 104 of discrete domains 106 onto the pad area 104, the substrate 100 is mated with a second substrate (not shown), such that the array 104 of discrete domains 106 joins two substrates by a bond. According to one or more embodiments of the present invention, the substrate 100 is BTC, and the second substrate (not shown) is a PCB. According to other embodiments of the present invention, the second substrate (not shown) is a part of any electronic device or assembly. Such devices and assemblies include, but are not limited to, circuit boards, electrical component leads, electronic packaging, or other like devices.

According to some embodiments of the present invention, the pad area 102 includes a gold layer or film. The array 104 of discrete domains 106, when the material is solder paste, improves solder distribution/spreading and more complete solder mixing with the surface finish on the pad area 104.

Dimensions of the pad area 102 are used as input to determine a deposition pattern for the material within the pad area 102 of the substrate 100. The optimum configuration or pattern for the array 104 of discrete domains, which again depends on the shape and dimensions of the pad area 102, is determined to optimize spread or coverage of the material across the pad area 104. The only additional cost for existing systems is a design, tool, and/or program, with an optimized array configuration for printing the material.

The geometry, pattern, and above described parameters of the array 104 of discrete domains 106 are optimized such that the array 104 provides optimal surface coverage on the pad area 102, which is variable. According to some embodiments of the present invention, the array 104 of discrete domains 106 covers about 30 to about 75% of the surface area of the pad area 102. According to other embodiments of the present invention, the array 104 of discrete domains 106 covers about 45 to about 60% of the surface area of the pad area 102.

Various methods and systems can be used to deposit an array 104 of discrete domains 106 of a material on a pad area 102 of a substrate 100. Tools are created that deposit the material in the desired deposition pattern described. Non-limiting examples of tools that can be used to create an array 104 of discrete domains 106 of a material on a pad area 102 of a substrate 100 include stencils and direct deposition machines, e.g., a solder paste jetting/printing machine.

According to one or more embodiments of the present invention, a stencil of the deposition pattern is created that includes an array of apertures. The stencil is used to deposit the array of discrete domains of the material onto the pad area 102 of the substrate 100.

Figure 2:
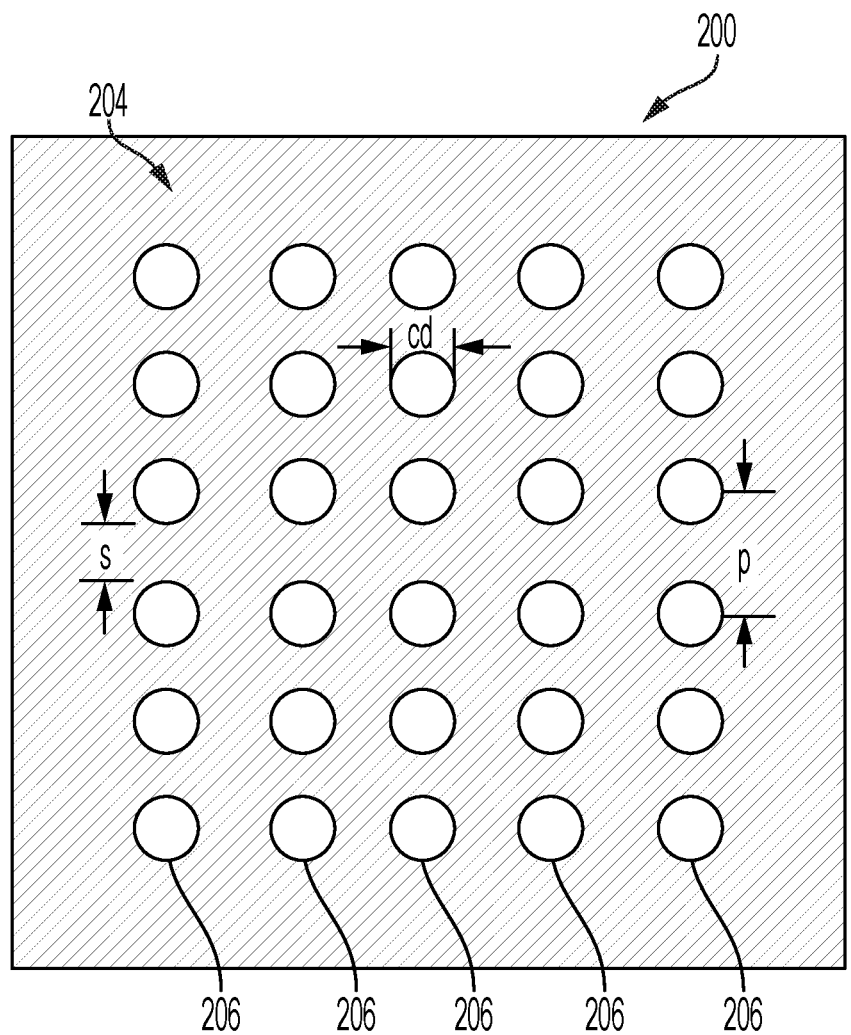
FIG. 2 depicts a top view of a stencil tool according to embodiments of the present invention.

FIG. 2 depicts a top view of a stencil 200 according to one or more embodiments of the present invention. The stencil 200 has an array 204 of apertures 206, having a critical dimension (cd), pitch (p), and spacing (s) that correspond to the associated configuration and parameters of the array 104 of discrete domains 106 of material to be deposited on the pad area 102 (see FIG. 1A). The thickness of the stencil 200 (not shown in the top view) corresponds to the associated height (h) or thickness (see FIG. 1B) of the array 104 of discrete domains 106.

The stencil 200 is used to either directly deposit the material of the array 104 of discrete domains 106 onto the substrate 100, or to deposit the material onto an intermediate tool that transfers and deposits the material onto the substrate 100.

Figure 3:
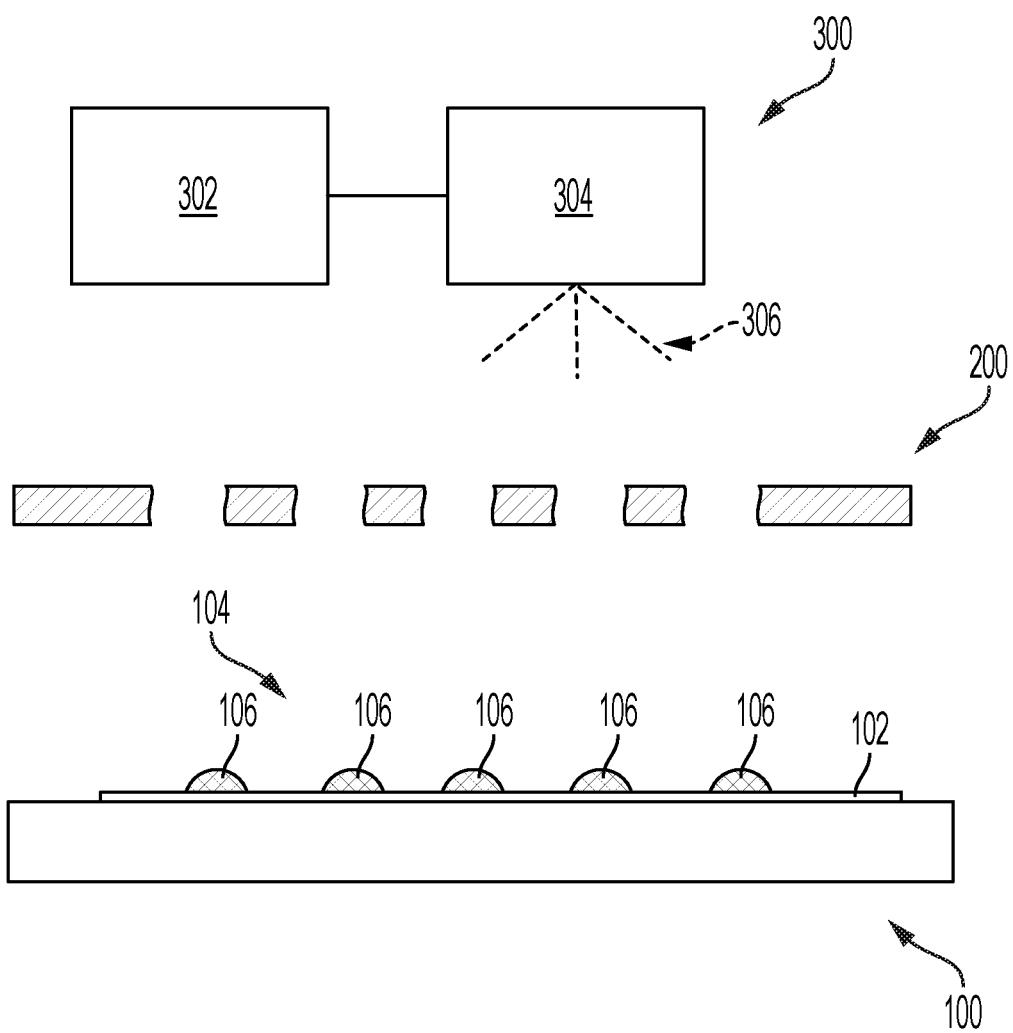
FIG. 3 depicts a system for forming an array of discrete domains of a material on a substrate according to one or more embodiments of the present invention.

FIG. 3 depicts a system 300 for forming an array 104 of discrete domains 106 of a material on a substrate 100 according to one or more embodiments of the present invention. The material 306 is deposited onto the pad area 102 of the substrate 100 using a dispensing tool 304. The material 306 is deposited directly onto the substrate 100 in an array 104 according to one or more embodiments of the present invention, for example by a dispensing tool that jets/deposits the material 306. According to other embodiments of the present invention, the material 306 is deposited using a stencil 200, either directly or indirectly, as discussed above with respect to FIG. 2.

The system 300 includes a controller 302 for controlling the system 300. The controller 302 includes, for example, a manual controller or a controller as described in FIG. 5. The dispensing tool 304 is communicatively connected to controller 302.

When a stencil is used, a second substrate, such as a BTC, to be mated to the substrate 100 can then be joined with the substrate 100. A curing process is performed, e.g., at ambient temperature, by a convection oven, chemical processes, or UV processes, to spread the material onto the surface of the pad area 102.

When the material 306 is directly deposited onto the substrate 100 after forming the array 104, the second substrate to be mated to the substrate 100 can then be joined with the substrate 100 before curing.

Figure 4:
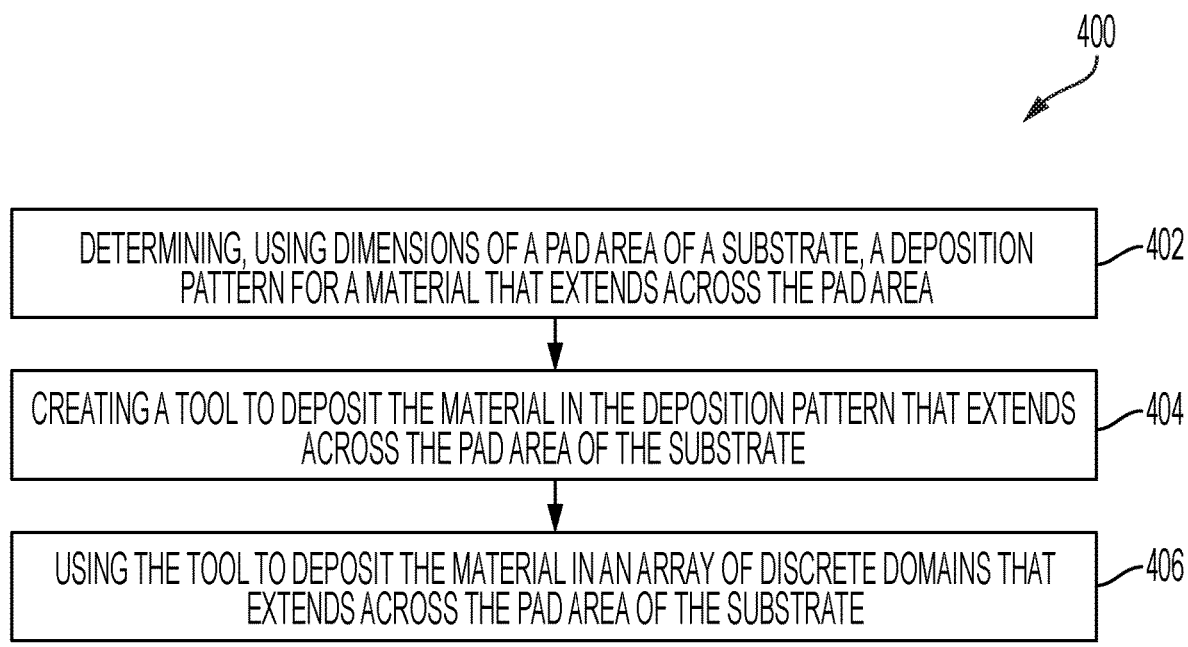
FIG. 4 depicts a flow chart of a method for creating a tool for forming an array of discrete domains of a material on a substrate according to embodiments of the present invention.

FIG. 4 depicts a flow chart of a method 400 for depositing a material in a pattern that extends across a pad area of a substrate. The tool will be created and used to form an array of discrete domains of the material on the pad area of the substrate according to embodiments of the present invention. As shown in box 402, the method 400 includes determining, using dimensions of a pad area of a substrate, a deposition pattern for a material within the pad area. The material is a contact or forming material, such as a solder paste or adhesive.

Provided the dimensions of the pad area, the coverage of the pad area is optimized such that the array extends to the edges of the pad area. The geometry and other parameters, including discrete domain size (e.g., critical dimension), location, spacing and pitch, are optimized to maximize coverage of the material across the pad area.

As shown in box 404, the method 400 includes creating a tool to deposit the material in the deposition pattern that extends across the pad area of the substrate.

A non-limiting example of the tool includes a stencil. The stencil can be used to directly deposit the material onto the substrate, or the stencil is used to transfer the material to an intermediate transfer tool, which then transfers the material to the substrate.

Another non-limiting example of the tool includes a direct deposition machine, such as a solder paste deposition/jetting machine. The direct deposition machine is configured to deposit the material in the deposition pattern within the pad area of the substrate. The direct deposition machine includes one or more nozzles that deposits the material within the pad area of the substrate in the deposition pattern that includes the array of discrete domains.

Other non-limiting examples of the tool include any tool, machine, or system that deposits the material within the pad area of the substrate in the deposition pattern that includes the array of discrete domains.

Once created, as shown in box 406, the method 400 includes using the tool to deposit the material in an array of discrete domains that extends across the pad area of the substrate.

Figure 5:
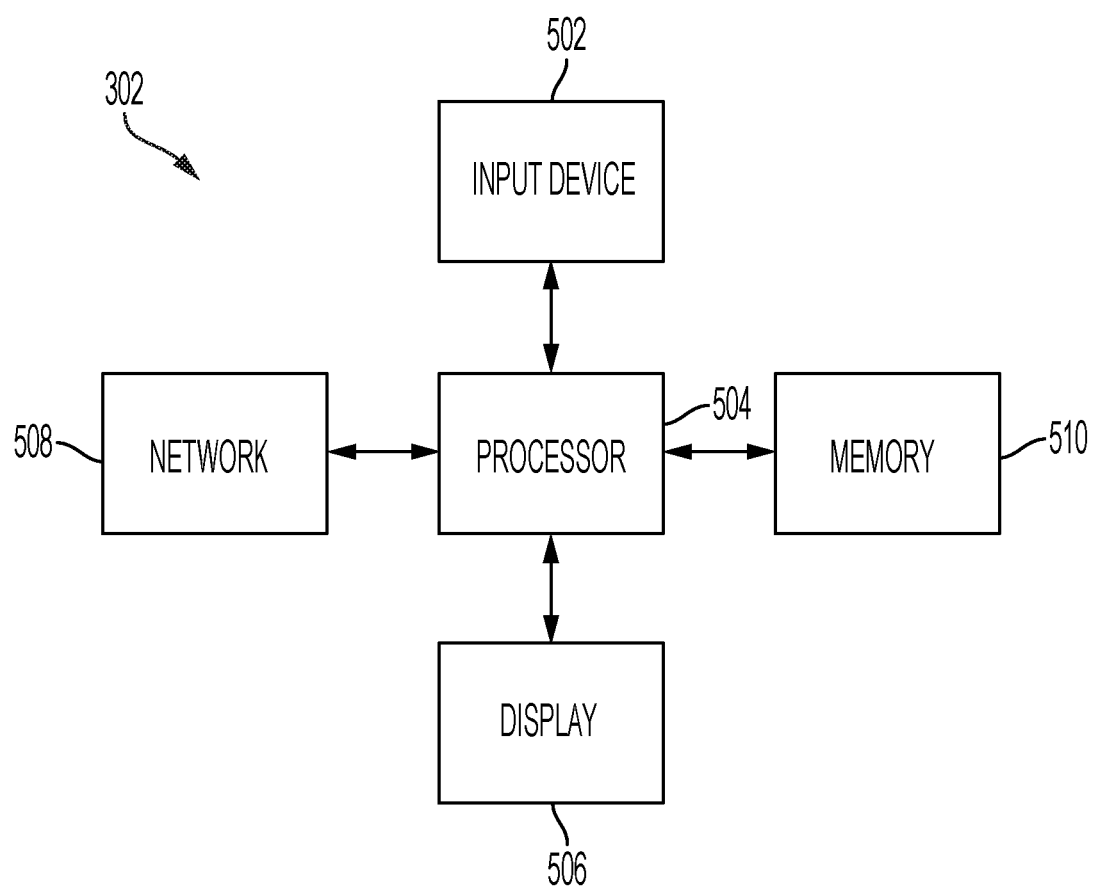
FIG. 5 depicts a portion of a controller for controlling a system according to embodiments of the present invention.

FIG. 5 depicts a portion of a controller 302 for controlling the system 300 according to embodiments of the present invention. The controller 302 includes a processor 504 that is communicatively connected to an input device 502, a network 508, a memory 510, and a display 506. In the illustrated exemplary embodiments, the input device 502 includes a keyboard, touchpad, mouse, or touch screen device, and the network 508 includes a local area network or the Internet. The display 506 can include a screen, touch screen device or digital display. In some embodiments of the present invention, the controller 302 includes a personal computer, smart phone or tablet device communicatively connected to the system 300.

In some embodiments of the present invention, the material is deposited by a manual process using the tool. In such a manual process, the controller 302 of the systems 300 is a manual tool (e.g., a pump or trigger) that an individual uses to deposit the material.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method for depositing a material to join two surfaces of an electronic assembly, the method comprising:
   using a tool to deposit an array of discrete domains of the material in a deposition pattern that extends across a pad area of a substrate with regular spacings of about 0.076 to about 0.203 millimeters (mm) between the discrete domains, the deposition pattern comprising the array of discrete domains extends across the pad area of the substrate and has a tangency with respect to an edge of the pad area of about 0.025 mm to about 0.127 mm.

2. The method of claim 1, wherein the material is a solder paste.

3. The method of claim 1, wherein the substrate is a bottom termination component.

4. The method of claim 1, wherein a pitch of the array of discrete domains is about 0.254 to about 1.27 millimeters (mm), and the regular spacings of the array of discrete domains is about 0.001 to about 0.254 millimeters (mm).

5. The method of claim 1, wherein the array of discrete domains includes a series of discrete domains that extends across the pad area in a first direction, and another series of discrete domains that extends across the pad area in the second direction.

* * * * *